United States Patent
Muller et al.

(10) Patent No.: US 6,693,051 B2
(45) Date of Patent: Feb. 17, 2004

(54) SILICON OXIDE BASED GATE DIELECTRIC LAYER

(75) Inventors: David A Muller, Basking Ridge, NJ (US); Gregory L. Timp, Urbana, IL (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/773,443

(22) Filed: Feb. 1, 2001

(65) Prior Publication Data

US 2002/0100946 A1 Aug. 1, 2002

(51) Int. Cl.[7] .................................. H01L 21/283
(52) U.S. Cl. ........................... 438/787; 438/287
(58) Field of Search ........................ 438/197–308, 438/758, 790, 787, FOR 193, FOR 494

(56) References Cited

U.S. PATENT DOCUMENTS

| | | | | |
|---|---|---|---|---|
| 4,783,238 A | * | 11/1988 | Roesner | 430/314 |
| 5,937,303 A | | 8/1999 | Gardner et al. | 438/305 |
| 6,074,919 A | | 6/2000 | Gardner et al. | 438/287 |
| 6,251,800 B1 | * | 6/2001 | Sun et al. | 438/541 |
| 2002/0047151 A1 | * | 4/2002 | Kim et al. | |

OTHER PUBLICATIONS

Klaus et al., "Atomic layer deposition of SiO2 using catalyzed and uncatalyzed self-limiting surface reactions", Jun.–Aug. 1999, World Scientific, Surface Review and Leeters vol. 6 No. 3–4, pp. 435–448.*

Ymaguchi et al., "Atomic–layer chemical–vapor–deposition of silicon dioxide films with an extremely low hydrogen content", Jun. 1998, Applied Surface Science vol. 130–132, pp. 202–207.*

Dori et al., "Optimized Silicon–Rich Oxide (SRO) Deposition Process for 5–V–Only Flash EEPROM Applications", Jun. 1993, IEEE Electron Device Letters, vol. 14, No. 6, pp. 283–285.*

Muller et al., "The electronic structure at the atomic scale of ultrathin gate oxides", Jun. 24, 1999, Macmillan Magazines LTD, Nature, vol. 399, pp. 758–761.*

"The Electronic Structure At The Atomic Scale Of Ultrathin Gate Oxides", *Nature*, vol. 399, Jun. 24, 1999. pp. 758–761.

"Electronic Properties of the Si/SiO$_2$ Interface from First Principles", Physical Review Letters, vol. 85, No. 6, Aug. 7, 2000, pp. 1298–1301.

* cited by examiner

*Primary Examiner*—George Fourson
*Assistant Examiner*—Suk San Foong
(74) *Attorney, Agent, or Firm*—Ozer M. N. Teitelbaum

(57) ABSTRACT

A semiconductor device having a dielectric layer formed between a first and a second conductive layer. The dielectric layer comprising a layer of silicon oxide, $SiO_{x \leq 2}$, having a dielectric constant greater than about 3.9 and less than or equal to about 12.

11 Claims, 3 Drawing Sheets

SILICON OXIDE BASED GATE DIELECTRIC LAYER

FIELD OF THE INVENTION

The present invention relates to semiconductor devices.

BACKGROUND OF THE INVENTION

In a field effect transistor ("FET"), a capacitance is associated with a gate dielectric layer, which insulates a gate electrode from a channel disposed within a semiconductor substrate. As semiconductor devices continue to be scaled down to reduce power consumption, the demand for higher input FET capacitances has increased. The input capacitance of a FET may be increased by either reducing the thickness of the gate dielectric layer or increasing its dielectric constant.

Gate dielectric layers have historically been realized by bulk silicon dioxide, $SiO_2$. To date, industry has been reducing the thickness of bulk silicon dioxide-based gate dielectric layers to increase input FET capacitances. However, at thicknesses of less than about 15 Å, bulk silicon dioxide becomes exceedingly susceptible to leakage currents tunneling through the gate dielectric layer. Thus, the leakage current problem is now becoming a practical concern.

To overcome this leakage current problem, industry has begun to explore various alternatives materials. These alternative materials have a dielectric constant greater than that of bulk silicon dioxide. As input FET capacitance is directly proportional to the dielectric constant of the gate dielectric layer and inversely proportional to the gate dielectric layer's thickness, it is believed that one of these alternative materials may enable the formation of a gate dielectric layer of a sufficient thickness to ameliorate the leakage current problem, while also increasing the input FET capacitance. Typical materials being investigated include metal-silicon-oxynitride and metal silicate, for example.

The use of such alternative materials as gate dielectric layers gives rise to other problems, however. The interface between the alternative materials under consideration and the underlying silicon substrate is of a poorer quality than the interface between bulk silicon dioxide and the silicon substrate. This poorer interface quality, attributable to several factors including an increased number of defects (e.g., dangling bonds) at the silicon interface, as well as the numbers of charges to become trapped by these defects. The trapped charges degrade device performance, reduce the reliability of the gate dielectric layer, and, therefore, reduce the FETs' so-called "mean time between failure."

SUMMARY OF THE INVENTION

In accordance with our invention, we have recognized that the search for gate dielectric materials other than silicon dioxide is somewhat misplaced. Our invention takes advantage of the silicon dioxide/silicon interface study by two of us, as reported in "The Electronic Structure at the Atomic Scale Of Ultrathin Gate Oxides," Nature, Vol. 399, June 1999, which theorizes that a layer of silicon oxide ($SiO_{X<2}$) of a sufficient thickness may exhibit a dielectric constant greater than that of bulk silicon dioxide (i.e., about 3.9). In particular, we have now recognized that at least one layer of silicon oxide ($SiO_{X \leq 2}$), in contrast with bulk silicon dioxide ($SiO_2$), may be advantageously employed as a gate dielectric layer. It appears to us now that a layer of silicon oxide at thickness of about 5 Å or less exhibits a dielectric constant greater than about 3.9. More particularly, a layer of silicon oxide apparently exhibits a dielectric constant of about 12 at thickness of about 3 Å. Consequently, it appears that a gate dielectric layer formed from a layer of silicon oxide, $SiO_{X \leq 2}$, will increase the input FET capacitance, while also providing a desirable interface with a silicon substrate. To further ameliorate leakage current problems—albeit with a somewhat reduced input capacitance—the gate dielectric layer may also comprise a second layer of silicon oxide, $SiO_{X \leq 2}$, formed upon the first layer of silicon oxide.

We have also recognized that a gate dielectric layer formed from one or two layers of silicon oxide, $SiO_{X \leq 2}$, each having a thickness of about 5 Å or less, may, however, still be insufficient to withstand damaging leakage current. Consequently, we have also invented a composite gate dielectric layer having a complementary dielectric layer formed upon a layer of silicon oxide, $SiO_{X \leq 2}$, in accordance with our co-pending, commonly assigned, U.S. Patent application, entitled "A COMPOSITE GATE DIELECTRIC LAYER," Ser. No. 09/773,442, filed concurrently with the present application. The complementary dielectric layer is of a sufficient thickness to substantially inhibit the flow of leakage current through the gate dielectric layer.

The addition of the complementary dielectric layer will likely reduce the input FET capacitance. As such, the complementary dielectric layer has a dielectric constant greater than that of the layer of silicon oxide. For example, the complementary dielectric layer may be formed from at least one of aluminate, silicate, $ZrO_2$, $HfO_2$, $TiO_2$, $Gd_2O_3$, $Y_2O_3$, $Si_3N_4$, $Ta_2O_5$ and $Al_2O_3$. Nonetheless, by judiciously choosing an alternative material for the complementary dielectric layer, and an appropriate thickness, a gate dielectric layer may be provided which exhibits an advantageous combination of properties (i.e., increased capacitance and reduced leakage current, for example) not achieved by the prior art approaches of fabricating a gate dielectric layer.

BRIEF DESCRIPTION OF THE DRAWINGS

The present invention will be better understood from reading the following description of non-limiting embodiments, with reference to the attached drawings, wherein below.

It should be emphasized that the drawings of the instant application are not to scale but are merely schematic representations, and thus are not intended to portray the specific dimensions of the invention, which may be determined by skilled artisans through examination of the disclosure herein.

DETAILED DESCRIPTION OF THE PRESENT INVENTION

As stated hereinabove, the input capacitance of a field effect transistor ("FET") is associated with a gate dielectric layer positioned between a gate electrode and a channel disposed within a silicon semiconductor. The continued pursuit of increasing input FET capacitances has led industry to two alternatives—namely, reducing the thickness of the gate dielectric layer, or increasing the dielectric constant of the gate dielectric layer. These efforts are driven by the inverse relationship between capacitance and the thickness of the gate dielectric layer, as well as the direct relationship between capacitance and dielectric constant. These relationships may be expressed using the following mathematical equations:

$$C=[\epsilon_0 * k * A]/t$$

or $$C/A=[\epsilon_0 * k]/t$$

where C is the capacitance, A is the area (length by width) of the dielectric layer, C/A is the capacitance per unit area, $\epsilon_0$ is a constant (i.e., $8.854 \times 10^{-12}$ Farads/meter) referred to as the permittivity in free space, k is the dielectric constant of the dielectric layer, and t is the thickness of the dielectric layer. From these mathematical expressions, it can be seen that the capacitance per unit area, C/A, may be increased by either decreasing the thickness, t, or increasing the dielectric constant, k.

Various advantages have been recognized in employing bulk silicon dioxide, $SiO_2$, as a gate dielectric layer at the interface of a silicon (Si) substrate. Consequently, efforts have been expended to fabricate gate dielectric layers from continuously thinner layers of bulk silicon dioxide, $SiO_2$. This drive to produce thinner bulk silicon dioxide layers is a result of its fixed dielectric constant, k.

Figure 1:
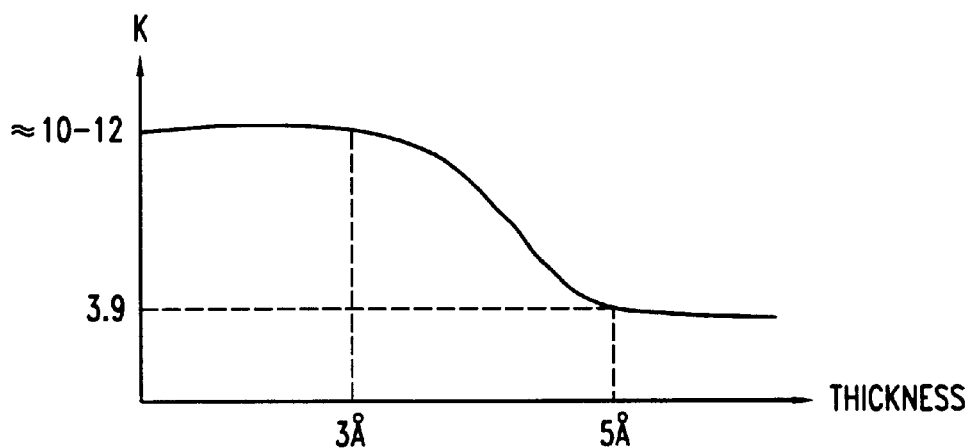
FIG. 1 is a graphical illustration of an embodiment of the present invention.

Referring to FIG. 1, the characteristics of a layer of silicon oxide, $SiO_{X \leq 2}$, according to an embodiment of the present invention are graphically illustrated. For the purposes of the present invention, silicon oxide, $SiO_{X \leq 2}$, is an oxide-based compound having a stoichiometry in which each silicon atom is bonded with two or less oxygen atoms. We have observed that at certain atomic thicknesses, silicon oxide, $SiO_{X \leq 2}$, exhibits a dielectric constant greater than that of bulk silicon dioxide. This general observation was initially theorized in the aforementioned study reported by two of us in "The Electronic Structure at the Atomic Scale Of Ultrathin Gate Oxides," Nature, Vol. 399, June 1999. Given its material composition, the layer of silicon oxide, $SiO_{X<2}$, creates a high quality interface with silicon. Consequently, we have recognized that a layer of silicon oxide, $SiO_{X \leq 2}$, may be advantageously employed as a gate dielectric layer to increase the input capacitance per unit area of a semiconductor device, such as a field effect transistor ("FET").

FIG. 1 graphically depicts the dielectric constant of a layer of silicon oxide, $SiO_{X \leq 2}$, as a function of the layer's thickness. At a thickness of about 5 Å, the dielectric constant of the layer of silicon oxide, $SiO_{X \leq 2}$, begins to increase beyond that of bulk silicon dioxide (i.e., about 3.9). Our inventive efforts have uncovered that the dielectric constant of the layer of silicon oxide, $SiO_{X \leq 2}$, peaks below 3 Å. We believe that the layer of silicon oxide reaches a dielectric constant in the range of about 8 to 12, at a thickness of about 3 Å or less. Consequently, we have recognized the advantageousness of forming a gate dielectric layer employing this layer of silicon oxide, $SiO_{X \leq 2}$, at the interface with the silicon substrate. The increased dielectric constant is a consequence of the proximity of the oxide layer to a material with a smaller bandgap—it is not necessary for the silicon oxide, $SiO_{X \leq 2}$, to be substoichiometric in the present invention.

Figure 2:
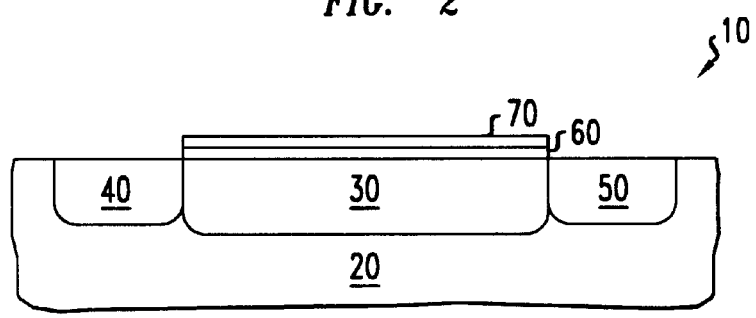
FIG. 2 is a cross-sectional view of an embodiment of the present invention.

Referring to FIG. 2, a first embodiment of the present invention is illustrated. Here, a cross-sectional view of a semiconductor device 10, such as a metal oxide semiconductor FET ("MOSFET"), for example, is shown. Other devices, however, will be apparent to skilled artisans upon reviewing the instant disclosure.

Semiconductor device 10 comprises a silicon substrate 20 having a conductive channel 30 electrically connected to a source 40 and a drain 50. Above channel 30 is a conductive layer, such as a gate electrode 70. By this arrangement, a gate dielectric layer 60 may be formed between channel 30 and gate electrode 70. As gate dielectric layer 60 has insulative properties, an input capacitance is formed between channel 30 and gate electrode 70.

To increase the input capacitance per unit area of device 10, we have recognized that gate dielectric layer 60 may be formed from a layer of silicon oxide, $SiO_{X \leq 2}$. The layer of silicon oxide, $SiO_{X \leq 2}$, as depicted in FIG. 1, exhibits a dielectric constant, k, greater than that of bulk silicon dioxide (i.e., about 3.9). As reflected in FIG. 1, this layer of silicon oxide, $SiO_{X \leq 2}$, has a thickness of about 5 Å or less to realize this increased dielectric constant. The dielectric constant of this layer of silicon oxide, $SiO_{X \leq 2}$, may be optimized in view of the potential flow of leakage current through gate dielectric layer 60.

In an advantageous embodiment, device 10 is operative with the layer of silicon oxide, $SiO_{X \leq 2}$, having at a thickness of about 4.5 Å and a dielectric constant of about 8.

Figure 3:
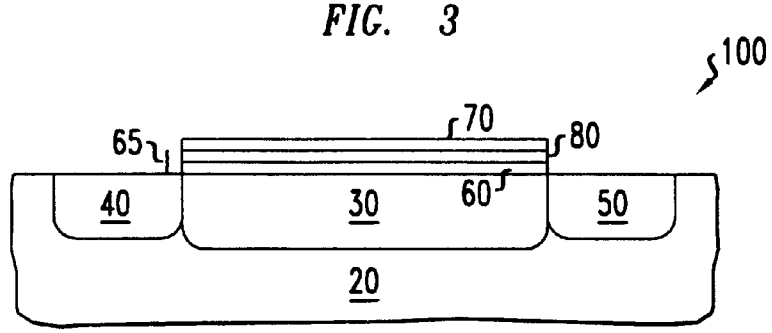
FIG. 3 is a cross-sectional view of another embodiment of the present invention.

Referring to FIG. 3, a cross-sectional view of a semiconductor device 100, such as a MOSFET, is illustrated according to a second embodiment of the present invention. As with semiconductor device 10 of FIG. 2, device 100 comprises a conductive channel 30 electrically connected to a source 40 and a drain 50, each of which are formed within a silicon substrate 20. Above channel 30 is a conductive layer, such as a gate electrode 70.

Formed between channel 30 and a gate electrode 70, is a gate dielectric layer 65. Gate dielectric layer 65 comprises a first layer 60 of silicon oxide, $SiO_{X \leq 2}$. First layer 60 has a dielectric constant, k, greater than that of bulk silicon dioxide. As shown in FIG. 1, first layer 60 has a thickness of about 5 Å or less to realize this increased dielectric constant.

To further reduce the propensity of leakage current, gate dielectric layer 65 of device 100 comprises a second layer 80 of silicon oxide, $SiO_{X \leq 2}$. Second layer 80 may also include one or more additional layers of silicon oxide, $SiO_{X \leq 2}$. Second layer 80, much like first layer 60, exhibits a dielectric constant, k, greater than about 3.9. To realize this dielectric constant, second layer 80 has a thickness of about 5 Å or less.

It should be noted that the inclusion of second layer 80, in conjunction with first layer 60, reduces the input capacitance per unit area of device 100 because the positioning of second layer 80 upon first layer 60 of silicon oxide, $SiO_{X \leq 2}$, creates a series capacitance. As such, the input capacitance, $C_{IN}$, of device 100 may be expressed using the following mathematical equations:

$$1/C_{IN}=1/C_1+1/C_2$$

or $$C_{IN}=[C_1 * C_2]/[C_1+C_2]$$

where $C_1$ is the capacitance created by first layer 60, and $C_2$ is the capacitance created by the second layer 80. Given the mathematical relationship between capacitance, dielectric constant and thickness, the above expressions may be restated as follows:

$$C_{IN}=[\epsilon_0 * k_1 * k_2 * A_1 * A_2]/[t_1 * k_2 * A_2 + t_2 * k_1 * A_1]$$

where $t_1$ and $t_2$ are the thicknesses of first and second layers, 60 and 80, $k_1$ and $k_2$ are the dielectric constant of first and second layers, 60 and 80, and $A_1$ and $A_2$ are the areas of first and second layers, 60 and 80. If first and second layers, 60 and 80, have the same width and lengths, and thus the same areas (i.e., $A_1=A_2$), then the above mathematical expression may be further restated as follows:

$$C_{IN}/A=[\epsilon_0 * k_1 * k_2]/[t_1 * k_2 + t_2 * k_1]$$

where $C_{IN}/A$ is input capacitance per unit area. From the hereinabove mathematical equations, input capacitance per unit area will decrease with the addition of second layer 80. As such, the thickness of second layer 80 may be optimized to further minimize the potential flow of leakage current through gate dielectric layer 65, while providing the maximum possible capacitance per unit area for device 100.

By this design, it is believed that the inclusion of second layer 80 in gate dielectric layer 65 reduces the leakage current over device 10 in FIG. 2. Second layer 80 advantageously may have a thickness of about 3.5 Å, a dielectric constant of in the range of about 9–10. The inclusion of second layer 80 also enables the thickness of first layer 60 to be potentially reduced to about 3.5 Å such that its dielectric constant is also in the range of about 9–10.

Figure 4:
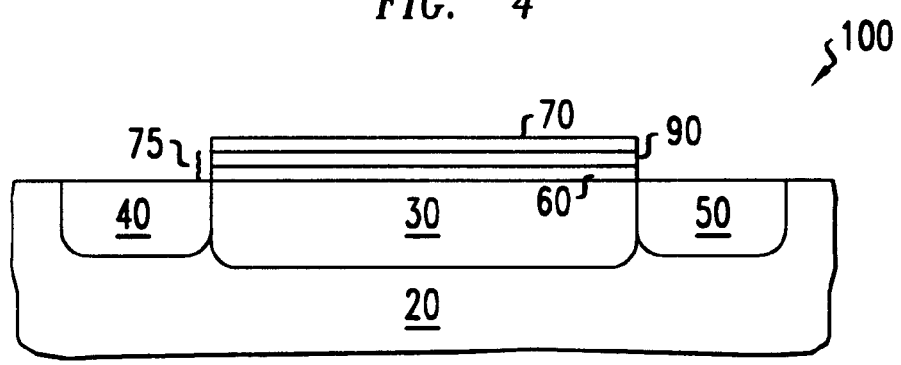
FIG. 4 is a cross-sectional view of another embodiment of the present invention.

Referring to FIG. 4, a third embodiment of the present invention is illustrated. Here, a cross-sectional view is shown of a semiconductor device 110. As with devices 10 and 100 of FIGS. 2 and 3, device 110 comprises a conductive channel 30 electrically connected to a source 40 and a drain 50, each of which are formed within a silicon substrate 20.

Formed between channel 30 and a gate electrode 70 is a composite dielectric layer 75. Composite dielectric layer 75 comprises at least two dielectric layers, one of which being a layer 60 of silicon oxide, $SiO_{X\leq 2}$. First layer 60 has a dielectric constant, k, greater than about 3.9, and as such, a thickness of about 5 Å or less. First layer 60 is formed upon channel 30 to provide an interface with silicon substrate 20 which is less rough in comparison with the alternative materials presently being explored for use as gate dielectric layers.

To further reduce the propensity of leakage current, composite dielectric layer 75 of device 110 comprises a complementary dielectric layer 90 formed from alternative materials. Complementary dielectric layer 90 has a higher dielectric constant than that of layer 60 of silicon oxide, $SiO_{X\leq 2}$. By selecting an alternative material having such a dielectric constant, complementary dielectric layer 90 may be sufficiently thicker than second layer 80 of FIG. 3 to further inhibit the flow of leakage current, all while maintaining the capacitance per unit area of device 110. Consequently, complementary dielectric layer 90 may have a thickness as high as about 60 Å, for example. Alternative materials considered for these purposes include, but are not limited to aluminates, silicates, $ZrO_2$, $HfO_2$, $TiO_2$, $Gd_2O_3$, $Y_2O_3$, $Si_3N_4$, $Ta_2O_5$ and $Al_2O_3$. Various substitutes will be apparent to skilled artisans upon reviewing the instant disclosure.

We estimate that complementary dielectric layer 90 advantageously may have a dielectric constant of greater than about 7 and as high as about 30 —though higher dielectric constants may be derived by skilled artisans upon reviewing the instant disclosure—a thickness range of about 5 Å and 60 Å. We believe that the inclusion of complementary dielectric layer 90 within composite gate dielectric layer 75 will further reduce the leakage current.

Figure 5:
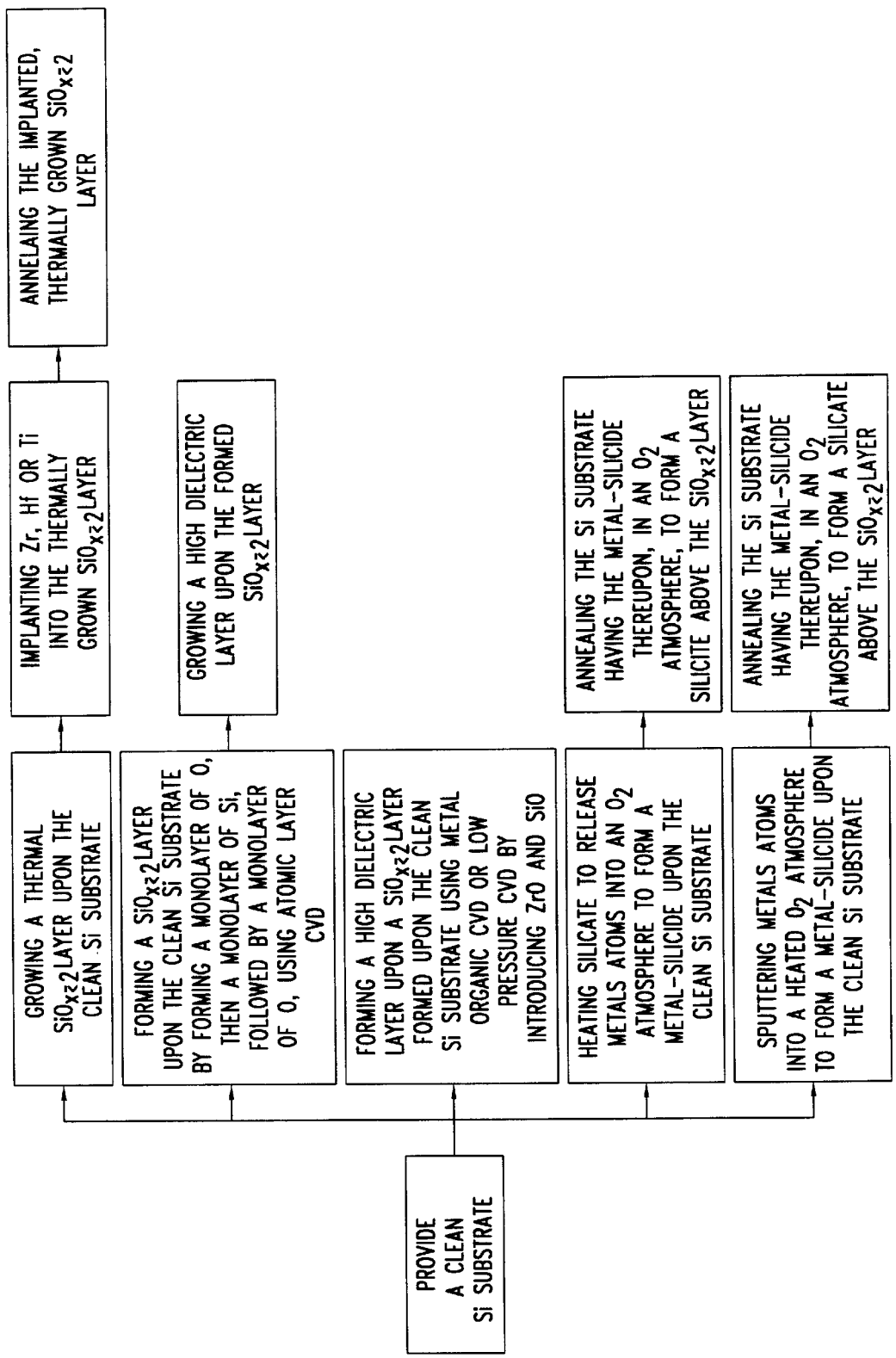
FIG. 5 is a flow chart of another embodiment of the present invention.

Referring to FIG. 5, a flow chart is illustrated. This flow chart depicts a number of methods for forming a gate dielectric layer. Variations and substitutions to the recited methods will be apparent to skilled artisans upon reviewing the disclosure herein.

According to a first processing path along the flow chart, a dielectric layer is formed upon a clean silicon substrate. Initially, a thermal layer of silicon dioxide is grown upon a clean silicon (Si) substrate. This growth step may be realized by rapid thermal oxidation at a temperature of about 1000° C., for about 5 seconds or less, at a pressure of 0.5 mTorr or less. Similar results have been obtained using a furnace at a temperature of about 800° C. or more, for about 10 seconds or more, at a pressure of about one (1) mTorr or less. A transition metal, such as Zr, Hf or Ti, for example, is subsequently implanted into the thermally grown layer of silicon dioxide. Thereafter, the implanted thermally grown layer of silicon dioxide is annealed in an $O_2$ atmosphere at a temperature of about 800° C. or more, for about 5 seconds or less, at a pressure of about one (1) mTorr or less. The anneal step forms a layer of silicon oxide, $SiO_{X<2}$, upon the silicon substrate, and the aforementioned complementary dielectric layer upon the silicon oxide layer. It should be noted that an etch back step may also be performed after the growth step, as well as after the implant step to insure that the resultant thickness of the silicon oxide is about 5 Å or less. This etch back step may be performed using an HF chemistry, as well as atomic scale electron-energy-loss spectroscopy ("EELS") to ascertain the appropriate thickness.

According to a second processing path, a layer of silicon oxide, $SiO_{X\leq 2}$, is formed upon a clean silicon substrate using atomic layer chemical vapor deposition ("ALCVD") techniques. Here, a monolayer of oxygen is first formed upon the substrate by ALCVD. In practice, however, a monolayer of a hydroxyl group is first formed upon the substrate by ALCVD. A monolayer of silicon (with a ligand) is thereafter formed upon the monolayer of oxygen (or hydroxyl group), and a second monolayer of oxygen (again in practice a hydroxyl group) is formed upon the monolayer of silicon (with a ligand). Each ALCVD step may be advantageously performed at a temperature of about 1000° C. Furthermore, each ALCVD step includes the step of introducing an oxygen or silicon precursor dose of about $10^{15}$ atoms/cm². Once the layer of silicon oxide is formed, the complementary dielectric layer may be formed upon the layer of silicon oxide. Alternatively, a second layer(s) of silicon oxide may be formed upon the layer of silicon oxide.

According to a third processing path, a composite dielectric layer is formed upon a clean silicon substrate by either a metal organic chemical vapor deposition ("MOCVD") or a low pressure chemical vapor deposition ("LPCVD") technique. As part of these MOCVD or LPCVD steps, gaseous ZrO and SiO are introduced in the presence of the substrate. Upon performing an anneal step in an $O_2$ atmosphere at a temperature of about 800° C. or more, for about 5 seconds or less, at a pressure of about (1) mTorr or less, a layer of silicon oxide, $SiO_{X\leq 2}$, is formed upon the substrate, and a metal-silicate is formed upon the layer of silicon oxide.

According to a fourth processing path, a composite dielectric layer is formed by initially evaporating a metal in an $O_2$ atmosphere. These metal atoms, deposited by any means, such as CVD or PVD, for example, form a layer of metal-oxide or metal-silicide upon the cleaned silicon substrate. Thereafter, an anneal step is performed in an $O_2$ atmosphere at a temperature range of about 800° C. and 1100° C., for about 5 seconds or less, at a pressure of about one (1) mTorr or less. Consequently, a layer of silicon oxide, $SiO_{X \leq 2}$, is formed upon the substrate, and a layer of metal-silicate is formed upon the layer of silicon oxide.

According to a fifth processing path along the flow chart, a composite dielectric layer is formed by initially sputtering transition metal atoms into an $O_2$ atmosphere having a temperature or about 800° C. or more. As an alternative to sputtering, a chemical vapor deposition or an evaporation step may be performed. These metal atoms form a layer of metal or metal-silicide upon the cleaned silicon substrate. Thereafter, an anneal step is performed in an $O_2$ atmosphere at a temperature of about 800° C. ore more, for about 5 seconds or less, at a pressure of about one (1) mTorr or less. Consequently, a layer of silicon oxide, $SiO_{X \leq 2}$, is formed upon the substrate, and a layer of metal-silicate is formed upon the layer of silicon oxide.

While the particular invention has been described with reference to illustrative embodiments, this description is not meant to be construed in a limiting sense. It is understood that although the present invention has been described, various modifications of the illustrative embodiments, as well as additional embodiments of the invention, will be apparent to one of ordinary skill in the art upon reference to this description without departing from the spirit of the invention, as recited in the claims appended hereto. Thus, while a gate dielectric layer for a field effect transistor ("FET") and a method of fabricating a gate dielectric layer is disclosed, it should be apparent to skilled artisans that the present invention may be applied to dielectric layers generally, as well as other devices requiring increased capacitance per unit area. It is therefore contemplated that the appended claims will cover any such modifications or embodiments as fall within the true scope of the invention.

What is claimed is:

1. A method of fabricating a gate dielectric layer, comprising:

forming a first layer of silicon oxide, SiOx, wherein x is less than 2, upon a silicon substrate and having a thickness of less than or equal to 5Å and a dielectric constant greater than about 3.9 and less than or equal to 12.

2. The method of claim 1, wherein forming the first layer of silicon oxide comprises:

forming a monolayer of oxygen upon the silicon substrate by at least one of atomic layer chemical vapor deposition, metal organic chemical vapor deposition and low pressure chemical vapor deposition;

forming a monolayer of silicon upon the monolayer of oxygen by at least one of atomic layer chemical vapor deposition, metal organic chemical vapor deposition and low pressure chemical vapor deposition; and forming a second monolayer of oxygen upon the monolayer of silicon by at least one of atomic layer chemical vapor deposition, metal organic chemical vapor deposition and low pressure chemical vapor deposition.

3. The method of claim 2, wherein at least one forming the monolayer of oxygen and forming the second monolayer of oxygen are performed at a temperature of about 1000° C.

4. The method of claim 2, wherein at least one forming the monolayer of oxygen and forming a second monolayer of oxygen comprise introducing a dose of about $10^{15}$ oxygen atmos/cm².

5. The method of claim 2, wherein the forming the monolayer of silicon comprises introducing a dose of about $10^{15}$ silicon atoms/cm².

6. The method of claim 1, wherein forming the first layer of silicon oxide comprises:

growing the layer of silicon oxide; and etching the silicon oxide layer to a thickness of less than or equal to 5Å.

7. The method of claim 2, further comprising:

forming a second layer of silicon oxide, SiOx, wherein x is less than 2, upon the first layer of silicon oxide, the second layer of silicon oxide having a thickness of less than or equal to about 5 Å and a dielectric constant of less than or equal to about 12.

8. The method of claim 7, wherein forming the second layer of silicon oxide comprises:

forming a third monolayer of oxygen upon the first layer of silicon oxide by at least one of atomic layer chemical vapor deposition, metal organic chemical vapor deposition and low pressure chemical vapor deposition;

forming a second monolayer of silicon upon the third monolayer of oxygen by at least one of atomic layer chemical vapor deposition, metal organic chemical vapor deposition and low pressure chemical vapor deposition; and forming a fourth monolayer of oxygen upon the second monolayer of silicon by at least one of atomic layer chemical vapor deposition, metal organic chemical vapor deposition and low pressure chemical vapor deposition.

9. The method of claim 7, wherein at least one of forming the third monolayer of oxygen, forming a second monolayer of silicon, and forming a fourth monolayer of oxygen are performed at a temperature of at least about 800° C.

10. The method of claim 7, wherein at least one of forming the third monolayer of oxygen and forming a fourth monolayer of oxygen comprise introducing a dose of about $10^{15}$ oxygen atoms/cm².

11. The method of claim 7, wherein forming the second monolayer of silicon comprises introducing a dose of about $10^{15}$ silcion atoms/cm².

* * * * *